United States Patent
Masuko et al.

(10) Patent No.: US 8,128,837 B2
(45) Date of Patent: Mar. 6, 2012

(54) LATENT CURING AGENT FOR EPOXY RESIN AND METHOD FOR MANUFACTURING THE SAME

(75) Inventors: Daisuke Masuko, Tochigi (JP); Katsuhiko Komuro, Tochigi (JP); Masahiko Ito, Tochigi (JP); Tadasu Kawashima, Tochigi (JP)

(73) Assignees: Sony Corporation, Tokyo (JP); Sony Corporation & Information Device Corporation, Tokyo (JP)

( * ) Notice: Subject to any disclaimer, the term of this patent is extended or adjusted under 35 U.S.C. 154(b) by 344 days.

(21) Appl. No.: 12/078,156

(22) Filed: Mar. 27, 2008

(65) Prior Publication Data
US 2008/0249257 A1    Oct. 9, 2008

(30) Foreign Application Priority Data
Apr. 4, 2007    (JP) .................. 2007-098692

(51) Int. Cl.
*C09K 3/00* (2006.01)
*C08L 63/00* (2006.01)
*C08G 59/18* (2006.01)
*C08G 59/68* (2006.01)

(52) U.S. Cl. ........... 252/182.13; 252/182.2; 252/183.11; 528/94; 528/117; 528/423; 523/429

(58) Field of Classification Search ............. 424/406; 528/94, 117, 423; 523/429; 252/182.13, 252/182.2, 183.11
See application file for complete search history.

(56) References Cited

U.S. PATENT DOCUMENTS
3,897,371 A * 7/1975 Moilliet et al. ............ 521/62
(Continued)

FOREIGN PATENT DOCUMENTS
JP    A 5-331264    12/1993

OTHER PUBLICATIONS
Machine Translation of JP H05-331264 A.*
Japanese Office Action issued in Japanese Application No. 2007-098692 mailed Nov. 30, 2011, with English-language translation.

*Primary Examiner* — Karuna P Reddy
(74) *Attorney, Agent, or Firm* — Oliff & Berridge, PLC

(57) ABSTRACT

A latent epoxy resin curing agent is provided which exhibits excellent solvent resistance and low-temperature fast-curing ability, and contains an imidazole-based compound as a main component. In the latent epoxy resin curing agent containing the imidazole-based compound as a main component, adduct particles formed through adduct reaction of an epoxy-based compound with the particulate imidazole-based compound are coated with an ethyl cellulose film. Furthermore, the surfaces of the adduct particles may be crosslinked with a polyfunctional isocyanate compound. A mixture of the epoxy-based compound, the particulate imidazole-based compound, and ethyl cellulose in a predetermined saturated hydrocarbon-based solvent is heated under stirring. Then, the epoxy-based compound and the particulate imidazole-based compound are subjected to adduct reaction to give a slurry of the adduct. After the slurry is cooled, the latent epoxy resin curing agent is filtrated.

5 Claims, No Drawings

U.S. PATENT DOCUMENTS 5,357,008 A * 10/1994 Tsai et al. ............... 525/526
5,420,218 A * 5/1995 Toribuchi et al. .......... 526/214
6,492,437 B1 * 12/2002 Musa et al. ............... 523/456

* cited by examiner

LATENT CURING AGENT FOR EPOXY RESIN AND METHOD FOR MANUFACTURING THE SAME

BACKGROUND OF THE INVENTION

1. Field of the Invention

The present invention relates to a latent epoxy resin curing agent having excellent solvent resistance and to a method for manufacturing the same.

2. Description of the Related Art

A latent epoxy resin curing agent having low-temperature fast-curing ability has been proposed in which a coating layer is formed on the surface of particles of an adduct of an imidazole compound and a polyfunctional epoxy compound through reaction with isocyanate (see Japanese Patent Application Laid-Open No. H05-331264). This latent curing agent is prepared as follows. The imidazole compound is added, in the presence of a dispersion stabilizer, to an organic solvent which can dissolve the imidazole compound and the epoxy compound but can not dissolve the adduct to be formed and which has a solubility parameter of 8 to 11. The mixture is heated to dissolve the imidazole compound. Then, the epoxy compound is added thereto and reacted with the imidazole compound to give a dispersion of the adduct particles, and the polyfunctional isocyanate compound is reacted with the adduct particles. The thus-obtained latent curing agent exhibits latency, i.e., does not initiate curing reaction at room temperature when mixed with an epoxy resin to be cured but initiates the curing reaction only after heated.

Meanwhile, it has been considered that an amphiphilic polymer compound having a high affinity both for the formed adduct and for the organic solvent can be preferably used as the dispersion stabilizer to be used upon preparing the latent epoxy resin curing agent described in Japanese Patent Application Laid-Open No. H05-331264 which contains the imidazole compound as a main component.

However, the dispersion-stabilizing ability of such an amphiphilic polymer compound is strongly affected, for example, by the chemical structures of the imidazole compound and epoxy compound and by the properties of the organic solvent. Therefore, when a person skilled in the art selects a suitable amphiphilic polymer compound, an excessive amount of trial and error is required. Moreover, in order to achieve sufficient low-temperature fast-curing ability, there is a strong demand for a latent epoxy resin curing agent that can provide an exothermic peak at 130° C. or less and an exothermic heat of 250 J/g or more in differential scanning calorimetry (DSC) of a thermosetting epoxy resin composition containing this curing agent.

SUMMARY OF THE INVENTION

It is an object of the present invention to solve the foregoing problems in the conventional technology. Specifically, the invention provides a latent epoxy resin curing agent which can be manufactured without using an amphiphilic polymer compound requiring a painful trial and error selection process, has excellent solvent resistance and low-temperature fast-curing ability, and contains an imidazole-based compound as a main component. The invention also provides a method for manufacturing this curing agent, in which the curing agent can be obtained in a form of particles in a single batch.

The present inventors have prepared particles of an adduct of an epoxy-based compound and an imidazole-based compound under the presence of ethyl cellulose by using as a reaction solvent a solvent that is, at least at reaction temperatures, a poor solvent for the imidazole-based compound but a good solvent for the epoxy-based compound and ethyl cellulose. Surprisingly, in this case, the inventors have found that ethyl cellulose not only contributes to the stabilization of the dispersion of the adduct particles formed through the adduct reaction of the epoxy resin with the particulate imidazole-based compound but also functions as the shells of the adduct particles. Therefore, excellent solvent resistance can be imparted to a final latent epoxy resin curing agent containing the imidazole-based compound as a main component and having low-temperature fast-curing ability. Thus, the invention has been completed.

Accordingly, the present invention provides a latent curing agent for an epoxy resin, including: particles of an adduct formed through adduct reaction of an epoxy-based compound with a particulate imidazole-based compound; and an ethyl cellulose film covering the surfaces of the adduct particles.

Moreover, the present invention provides a method for manufacturing the above latent curing agent for an epoxy resin, the method including: heating a mixture of an epoxy-based compound, a particulate imidazole-based compound, and ethyl cellulose in a poor solvent for the imidazole-based compound to 110 to 130° C. under stirring with the fine particles of the imidazole-based compound remaining dispersed; allowing the epoxy-based compound to undergo adduct reaction with the particulate imidazole-based compound to give a slurry of adduct particles; and separating a particulate latent epoxy resin curing agent from the slurry.

In the latent epoxy resin curing agent of the present invention containing the imidazole-based compound as a main component, the adduct particles formed through the adduct reaction of the epoxy-based compound with the particulate imidazole-based compound are coated with the ethyl cellulose film. Therefore, this curing agent exhibits excellent solvent resistance. Moreover, in the manufacturing method of the present invention, the ethyl cellulose contributes to the stabilization of the dispersion of the adduct particles during the formation of the adduct from the epoxy-based compound and the particulate imidazole-based compound and functions as the shells of the adduct particles. In addition to this, the ethyl cellulose serves as the reaction site for the polyfunctional isocyanate compound which contributes to the storage stability. Accordingly, a latent epoxy resin curing agent exhibiting excellent solvent resistance and low-temperature fast-curing ability and containing an imidazole-based compound as a main component can be manufactured in a form of particles in a single batch without using an amphiphilic polymer compound requiring a painful trial and error selection process.

DETAILED DESCRIPTION OF THE PREFERRED EMBODIMENTS

A latent epoxy resin curing agent of the present invention containing an imidazole-based compound as a main component includes: adduct particles formed through adduct reaction of an epoxy-based compound with a particulate imidazole-based compound; and an ethyl cellulose film covering the surfaces of the adduct particles. Moreover, the ethyl cellulose film may be crosslinked with a polyfunctional isocyanate compound. In this manner, the solvent resistance and storage stability can be further improved.

Preferred examples of the epoxy-based compound constituting the adduct particles include compounds and resins having two or more epoxy groups in their molecules. These may be liquid or solid. Specific examples of such an epoxy-based compound include known epoxy resins such as: glycidyl ethers obtained by reacting epichlorohydrin with a polyhydric phenol such as bisphenol A, bisphenol F, bisphenol S, hexahydrobisphenol A, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol-novolac, or cresol-novolac; polyglycidyl ethers obtained by reacting epichlorohydrin with an aliphatic polyhydric alcohol such as glycerin, neopentyl glycol, ethylene glycol, propylene glycol, butylene glycol, hexylene glycol, polyethylene glycol, or polypropylene glycol; glycidyl ether esters obtained by reacting epichlorohydrin with a hydroxycarboxylic acid such as p-hydroxybenzoic acid or β-hydroxynaphthoic acid; polyglycidyl esters obtained from polycarboxylic acids such as phthalic acid, methylphthalic acid, isophthalic acid, terephthalic acid, tetrahydrophthalic acid, hexahydrophthalic acid, endomethylene tetrahydrophthalic acid, endomethylene hexahydrophthalic acid, trimellitic acid, and polymerized fatty acids; glycidylaminoglycidyl ethers obtained from aminophenols and aminoalkylphenols; glycidylaminoglycidyl esters obtained from aminobenzoic acids; alicyclic epoxy resins such as glycidylamines obtained from aniline, toluidine, tribromoaniline, xylylenediamine, diamino cyclohexane, bisaminomethylcyclohexane, 4,4'-diaminodiphenyl methane, and 4,4'-diaminodiphenyl sulfone; and epoxydized polyolefins.

Fine particles of any imidazole-based compound used in imidazole-based latent curing agents may be appropriately used as the imidazole-based compound constituting the adduct particles. Examples of such an imidazole-based compound include imidazoles in a form of solid particles at room temperature, such as 2-methyl imidazole, 2-undecyl imidazole, 2-heptadecyl imidazole, 2-phenyl imidazole, 2-phenyl-4-methyl imidazole, 1-cyanoethyl-2-undecyl imidazole, and 1-cyanoethyl-2-phenyl imidazole.

When the particle size of the particulate imidazole is too large, the adduct formation reaction tends not to proceeds sufficiently. Therefore, the particle size is desirably 10 μm or less. Moreover, the particulate imidazole may be pulverized in advance.

In the ratio of the epoxy-based compound and the particulate imidazole-based compound used when the adduct particles are formed, when the amount of the epoxy-based compound is too large, the reactivity of the adduct tends to be too low. In contrast, when the amount of the particulate imidazole-based compound is too large, the reactivity of the adduct tends to be excessively high. Therefore, the amount of the imidazole-based compound is preferably 200 to 1 parts by weight, more preferably 100 to 10 parts by weight, and particularly preferably 70 to 40 parts by weight with respect to 100 parts by weight of the epoxy-based compound.

Preferably, the adduct particles are substantially spherical, and the particle size thereof is preferably 1 to 10 μm and more preferably 2 to 7 μm in terms of curability and dispersibility.

In the ethyl cellulose which forms the ethyl cellulose film covering the adduct fine particles, the degree of substitution of three hydroxyl groups in the cellulose skeleton is preferably 2.25 to 2.60, more preferably 2.30 to 2.55, and particularly preferably 2.40 to 2.52, as the average per unit skeleton. When the degree of substitution of the hydroxyl groups is outside the above range, the solubility of the ethyl cellulose in the reaction system is adversely affected. Specific examples of the ethyl cellulose include N300, N200, N100, and N50 available from Hercules Incorporated.

When the used amount of ethyl cellulose is too small, the particle size of the adduct tends to increase, so that the dispersion stability is reduced. When the amount is too large, ethyl cellulose tends not to form the shell and to remain as a residue. Therefore, the amount of ethyl cellulose is preferably 1 to 50 parts by weight, more preferably 25 to 50 parts by weight, and particularly preferably 5 to 10 parts by weight with respect to 100 parts by weight of the total of the epoxy-based compound and imidazole-based compound constituting the adduct particles. Note that the presence of the ethyl cellulose film can be confirmed by the presence of a characteristic peak of ethyl cellulose due to thermal decomposition in gas chromatography analysis of a sample.

In the latent epoxy resin curing agent of the present invention, the ethyl cellulose film is crosslinked with the polyfunctional isocyanate compound. Any conventional compound used for microencapsulation of an epoxy-based latent curing agent can be used as the polyfunctional isocyanate compound. Examples of the polyfunctional isocyanate compound include toluene diisocyanate, methylene diphenyl diisocyanate, hydrogenated methylene diphenyl diisocyanate, 1,5-naphthalene diisocyanate, isophorone diisocyanate, hexamethylene diisocyanate, kylylene diisocyanate, hydrogenated xylylene diisocyanate, tetramethylxylene diisocyanate, 1,3, 6-hexamethylene triisocyanate, lysine diisocyanate, triphenylmethane triisocyanate, and tris(isocyanatephenyl)thiophosphate. These may be used alone or in combination of two or more thereof.

When the used amount of the polyfunctional isocyanate compound is too small, the solvent resistance of the latent epoxy resin curing agent tends to be insufficient. When the amount thereof is too large, the low-temperature curability thereof tends to deteriorate. Therefore, the amount of the polyfunctional isocyanate compound is preferably 0.5 to 50 parts by weight, more preferably 1 to 20 parts by weight, and particularly preferably 2 to 12 parts by weight with respect to 100 parts by weight of the adduct particles.

The latent epoxy resin curing agent of the present invention can be manufactured in a single batch as follows.

First, a mixture of the epoxy-based compound, the particulate imidazole-based compound, and ethyl cellulose in a poor solvent for the imidazole-based compound is heated to 110 to 130° C. under stirring with the fine particles of the imidazole based compound remaining dispersed. Then, the epoxy-based compound is allowed to undergo adduct reaction with the particulate imidazole-based compound, whereby adduct particles are formed.

As used herein, the above poor solvent for the imidazole-based compound in a form of solid particles at room temperature has the following characteristics. That is, the solvent can dissolve only a small amount of the above imidazole-based compound not only at room temperatures but also at a reaction temperature of 110 to 130° C. (i.e., 1 g/100 g or less at 130° C.) but serves as a good solvent for the epoxy-based compound and ethyl cellulose (i.e., the solubility is 5 g/100 g or more at 130° C.). Specifically, grade No. 1 kerosene stipulated in JIS (Japanese Industrial Standards), a saturated hydrocarbon-based washing solvent (such as Shellsol MC-311, Shell Chemicals Japan Ltd., or No. 0 solvent-L, NIPPON OIL CORPORATION), or the like can be used.

The used amount of the solvent may be determined by taking into consideration the solubility of the epoxy-based compound, the imidazole-based compound, and ethyl cellulose and the concentration and viscosity of the slurry to be formed. Typically, the amount is 300 to 2,000 parts by weight with respect to 100 parts by weight of the total of the above components.

The stirring during the formation of the adduct particles may be performed by means of a propeller stirrer, a homogenizer, or the like and is performed preferably under the condition of 3,000 to 20,000 rpm in order to control the particle size.

The reaction temperature during the formation of the adduct particles is 110 to 130° C. This is because an excessively low reaction temperature tends to results in insufficient reaction and because an excessively high reaction temperature tends to result in the decomposition of the formed adduct.

The adduct reaction is terminated when the reaction mixture turns brown. The reaction is typically completed after heating for 20 minutes to 2 hours. In this manner, the slurry of the adduct particles is obtained. Then, the entire slurry is cooled and filtrated, whereby a powder of a latent epoxy resin curing agent containing the imidazole-based compound as a main component can be obtained. This latent epoxy resin curing agent has a structure in which the surfaces of the adduct particles formed through the adduct reaction of the epoxy-based compound with the particulate imidazole-based compound are coated with the ethyl cellulose film.

If the ethyl cellulose film is reacted with the polyfunctional isocyanate compound, the slurry of the obtained adduct particles is stirred without heating and is cooled to 80 to 100° C. at which the adduct reaction of the epoxy-based compound and the imidazole-based compound does not substantially occur. While this temperature is maintained, the polyfunctional isocyanate compound is added to the slurry and allowed to react with the hydroxyl groups in the ethyl cellulose film to crosslink the ethyl cellulose film. Typically, the crosslinking reaction is completed in 30 minutes to 2 hours. After completion of the reaction, the slurry is cooled to room temperature, and the solid is separated through filtration, washed with an organic medium such as hexane, and dried, whereby a powder of latent epoxy resin curing agent excellent in solvent resistance and having a particle size of 1 to 10 μm can be obtained.

The latent epoxy resin curing agent of the present invention can provide a thermosetting epoxy resin composition of low-temperature fast-curing type by adding the curing agent to a thermosetting epoxy resin optionally with other additives (such as a pigment, filler, and silane coupling agent) and stirring the mixture according to a conventional method. Typically, the latent epoxy resin curing agent is added to the thermosetting epoxy resin in an amount of preferably 10 to 100 parts by weight and more preferably 25 to 70 parts by weight with respect to 100 parts by weight of the thermosetting epoxy resin.

Since the latent epoxy resin curing agent excellent in solvent resistance and having low-temperature fast-curing ability is used, this thermosetting epoxy resin composition is excellent in storage stability although it is of a one-component type. In addition to this, the curing agent has an advantage in that a solvent used therewith can be selected from a wide variety of solvents.

Moreover, the thermosetting epoxy resin composition can be used as an anisotropic conductive composition by further adding thereto known conductive particles, such as nickel particles, for anisotropic conductive connection and a known film-forming resin such as phenoxy resin. When formed into a film shape, the thermosetting epoxy resin composition can be used as an anisotropic conductive film. The type, particle size, and amount to be added of the conductive particles and the type, amount to be added, thickness, and the like of the film-forming component may be the same as those in known anisotropic conductive pastes and anisotropic conductive films. An example of the composition of a representative anisotropic conductive paste or film is 8 to 12 parts by weight of the latent epoxy resin curing agent, 50 to 80 parts by weight of phenoxy resin, 20 to 50 parts by weight of an epoxy compound, 5 to 30 parts by weight of epoxy-modified polyolefin, 1 to 20 parts by weight of a silane coupling agent, and 1 to 20 parts by weight of conductive particles. Moreover, other solvents, monomers for dilution, and the like may be appropriately added if needed. Such an anisotropic conductive paste or anisotropic conductive film allows low-temperature short-time connection at 150° C. in about 5 seconds and provides a low electric resistance and a good bonding strength.

EXAMPLES

Hereinbelow, the present invention is specifically described by way of Examples.

Example 1

A three-necked flask made of Teflon (registered trademark) and equipped with a cooling tube was charged with 179 g of Shellsol MC-311 (product of Shell Chemicals Japan Ltd.), 14 g of an epoxy resin (EPICOAT 828, Japan Epoxy Resins Co., Ltd.), 6 g of 2-phenyl-4-methyl imidazole in a form of fine particles having a particle size of 2 μm, and 2 g of ethyl cellulose (N300, Hercules Incorporated, the degree of substitution of hydroxy groups: 2.40 to 2.52). The reaction mixture was heated to 130° C. under stirring at 13,500 rpm. The fine particles of the imidazole-based compound remained present during the period from the start of the reaction to the time at which the temperature reached 130° C. The stirring was continued for 1 hour, whereby a brown slurry was obtained.

Then, the heating was terminated, and the obtained slurry was cooled to room temperature. The precipitate was separated through filtration, washed with heptane, and dried, whereby 22 g of a powder of a latent epoxy resin curing agent having an average particle size of 5 μm was obtained.

Example 2

The same procedure as in Example 1 was repeated to give a brown slurry. The heating was terminated, and the obtained slurry was allowed to cool to 80° C. under stirring. The temperature of the slurry was maintained at 80° C., and 2 g of a liquid polyfunctional isocyanate compound-containing mixture (CORONATE 1130, product of NIPPON POLYURETHANE INDUSTRY CO., LTD., a mixture of diphenylmethan-4-4'-diisocyanate and polymethylene polyphenyl polyisocyanate) was added dropwise to the slurry under stirring. Then, the reaction mixture was subjected to crosslinking reaction for 30 min. After completion of the reaction, the reaction mixture was cooled to room temperature, and the precipitate was separated through filtration, washed with heptane, and dried, whereby 24 g of a powder of a latent epoxy resin curing agent having an average particle size of 5 μm was obtained.

Comparative Example 1

The same procedure as in Example 2 was repeated except that ethyl cellulose was not used. In this case, a powder-like product was not obtained, and only the lumps of the product were obtained.

Comparative Example 2

The same procedure as in Example 2 was repeated except that 2-ethyl-4-methyl imidazole was used in place of 2-phenyl-4-methyl imidazole, whereby 24 g of a powder of a latent epoxy resin curing agent having an average particle size of 5 μm was obtained.

Evaluation Test Examples

<Solvent Resistance Test>

3 parts by weight of each of the latent epoxy resin curing agents obtained in Examples 1 and 2 and Comparative Examples 1 and 2 was mixed with 7 parts by weight of a liquid epoxy composition (a bis A type liquid epoxy compound (JER828, Japan Epoxy Resins Co., Ltd.)/a bis F type liquid epoxy compound (JER807, Japan Epoxy Resins Co., Ltd.) =2/8 (in weight ratio)). Then, 4 parts by weight of the mixture was uniformly mixed with 1 part by weight of a solvent shown in Table 1 (TOL (toluene), ACET (ethyl acetate), or MEK (methyl ethyl ketone)), whereby a thermosetting epoxy resin composition was prepared. This composition was charged into a sealed container and left to stand in an oven at 40° C., and the time at which the composition lost its fluidity was measured. The measured time is shown in Table 1. Moreover, the solvent resistance test results for Reference Example 1 in which a commercially available latent epoxy resin curing agent (HX3941, Asahi Kasei Corporation) was used are also shown in Table 1.

<DSC Measurement>

A thermosetting epoxy resin composition prepared as in the solvent resistance test was subjected to thermal analysis by means of a differential scanning calorimeter (DSC, DSC-60, product of Shimadzu Corporation) to measure the exothermic peak temperature (° C.) and the total exothermic heat (J/g). The thermal analysis was performed just after preparation and after the composition was stored at 60° C. for 120 hours (note that for Example 2, the composition was stored for 36 hours in stead of 120 hours). The results obtained are shown in Table 1. Practically, the exothermic peak falls within the range of preferably 90 to 160° C., and the total exothermic heat is preferably 250 J/g or more. The DSC measurement results for Reference Example 1 in which the commercially available latent epoxy resin curing agent (HX3941, Asahi Kasei Corporation) was used are also shown in Table 1.

TABLE 1

| | Solvent resistance (time) | | | DSC (just after preparation) | | DSC (60° C., 120 hrs.) | |
|---|---|---|---|---|---|---|---|
| | | | | Exothermic peak | Exothermic heat | Exothermic peak | Exothermic heat |
| | TOL | ACET | MEK | (° C.) | (J/g) | (° C.) | (J/g) |
| Ex. 1 | 720 or more | 720 or more | 600 | 127 | 378 | 127 | 394 |
| Ex. 2 | 720 or more | 720 or more | 600 | 116 | 305 | 168 | 276 |
| Comp. Ex. 1 | Particle-like adduct not obtained | | | — | — | — | — |
| Comp. Ex. 2 | Less than 120 | Less than 48 | Less than 48 | 127 | 400 | 127 | 415 |
| Ref. Ex. 1 | 9 | 5 | 5 | 120 | 330 | 125 | 237 |

As described above, in the latent epoxy resin curing agent of Example 1, the adduct particles are covered with ethyl cellulose. In addition, in the latent epoxy resin curing agent of Example 2, the ethyl cellulose film is further crosslinked with the polyfunctional isocyanate compound. As can be seen from the results in Table 1, the curing agents of Examples 1 and 2 exhibited better solvent resistance than the commercially available latent epoxy resin curing agent of Reference Example 1, and the DSC measurement results of Examples 1 and 2 were comparable to those of Reference Example 1. Meanwhile, in the curing agent in which ethyl cellulose was not used, the dispersion stabilizing effect was not obtained, and the particle-like adduct was not obtained. Hence, the curing agent could not be mixed with the epoxy resin. Moreover, in the latent curing agent of Comparative Example 2 in which a compound that dissolves in the solvent during the adduct reaction was used as the imidazole-based compound, the latent curing agent was obtained as particles, but the solvent resistance was poor.

In the latent epoxy resin curing agent of the present invention, the adduct particles formed through the adduct reaction of the epoxy-based compound with the particulate imidazole-based compound are covered with the ethyl cellulose film, so that the curing agent exhibits excellent solvent resistance. Accordingly, the curing agent allows a thermosetting epoxy resin composition to cure at relatively low temperatures and in a short time and is thus useful as an electronic material-bonding material that can cure at low temperatures.

The entire disclosure of the specification, claims and summary of Japanese Patent Application No. 2007-98692, filed on Apr. 4, 2007 is hereby incorporated by reference.

What is claimed is:

1. A method for manufacturing a latent curing agent for an epoxy resin, the latent curing agent for an epoxy resin comprising:

particles of an adduct formed through adduct reaction of an epoxy-based compound with a particulate imidazole-based compound; and a film of ethyl cellulose crosslinked with a polyfunctional isocyanate, the film covering surfaces of the adduct particles, wherein the ethyl cellulose crosslinked with the polyfunctional isocyanate is derived from an ethyl cellulose in which a degree of substitution of three hydroxyl groups in a cellulose skeleton is 2.25 to 2.60;

the method comprising:

heating a mixture of the epoxy-based compound, the particulate imidazole-based compound, and the ethyl cellulose in which a degree of substitution of three hydroxyl groups in a cellulose skeleton is 2.25 to 2.60, in a poor solvent for the imidazole-based compound, to 110 to 130° C. under stirring with fine particles of the imidazole-based compound remaining dispersed;

allowing the epoxy-based compound to undergo the adduct reaction with the particulate imidazole-based compound to give a slurry of adduct particles;

cooling the slurry of adduct particles to 80 to 100° C.;

following the cooling, adding a polyfunctional isocyanate compound and allowing the polyfunctional isocyanate to crosslink the ethyl cellulose; and separating a particulate latent epoxy resin curing agent from the slurry.

2. The method for manufacturing the latent curing agent for the epoxy resin according to claim 1, wherein the imidazole-based compound is 2-phenyl-4-methyl imidazole.

3. The method according to claim 1, wherein an amount of the ethyl cellulose is 1 to 50 parts by weight with respect to 100 parts by weight of the total of the epoxy-based compound and the imidazole-based compound constituting the adduct particles.

4. The method according to claim 1, wherein an amount of the imidazole-based compound is 1 to 200 parts by weight with respect to 100 parts by weight of the epoxy-based compound.

5. The method according to claim 1, wherein an amount of the polyfunctional isocyanate compound is 0.5 to 50 parts by weight with respect to 100 parts by weight of the adduct particles.

* * * * *